(12) United States Patent
Dong et al.

(10) Patent No.: US 10,993,330 B2
(45) Date of Patent: Apr. 27, 2021

(54) DISPLAY PANEL, DISPLAY DEVICE, AND METHOD FOR MANUFACTURING DISPLAY PANEL

(71) Applicants: BOE TECHNOLOGY GROUP CO., LTD., Beijing (CN); CHENGDU BOE OPTOELECTRONICS TECHNOLOGY CO., LTD., Sichuan (CN)

(72) Inventors: Xiangdan Dong, Beijing (CN); Youngyik Ko, Beijing (CN); Ming Hu, Beijing (CN); Tingliang Liu, Beijing (CN)

(73) Assignees: BOE TECHNOLOGY GROUP CO., LTD., Beijing (CN); CHENGDU BOE OPTOELECTRONICS TECHNOLOGY CO., LTD., Sichuan (CN)

( * ) Notice: Subject to any disclaimer, the term of this patent is extended or adjusted under 35 U.S.C. 154(b) by 213 days.

(21) Appl. No.: 16/078,472

(22) PCT Filed: Jan. 8, 2018

(86) PCT No.: PCT/CN2018/071790
§ 371 (c)(1),
(2) Date: Aug. 21, 2018

(87) PCT Pub. No.: WO2018/218966
PCT Pub. Date: Dec. 6, 2018

(65) Prior Publication Data
US 2020/0236792 A1 Jul. 23, 2020

(30) Foreign Application Priority Data
May 27, 2017 (CN) .......................... 201710393763.0

(51) Int. Cl.
*H05K 3/32* (2006.01)
*H01L 23/498* (2006.01)

(52) U.S. Cl.
CPC ......... *H05K 3/323* (2013.01); *H01L 23/4985* (2013.01); *H05K 2201/10128* (2013.01)

(58) Field of Classification Search
CPC .......... H05K 3/323; H05K 2201/10128; H01L 23/4985
See application file for complete search history.

(56) References Cited

U.S. PATENT DOCUMENTS

2005/0162603 A1* 7/2005 Cheng ...................... H01L 24/83
349/149
2013/0175528 A1* 7/2013 Han ..................... H01L 23/4985
257/48
(Continued)

FOREIGN PATENT DOCUMENTS

| CN | 103594485 A | 2/2014 |
| CN | 104035253 A | 9/2014 |

(Continued)

OTHER PUBLICATIONS

First Office Action for CN Appl. No. 201710393763.0, dated Nov. 29, 2018.
(Continued)

*Primary Examiner* — Karen Kusumakar
(74) *Attorney, Agent, or Firm* — Dinsmore & Shohl LLP

(57) ABSTRACT

The present disclosure relates to a display panel and a method of fabricating the same, and a display device. A display panel is provided which comprises: a display substrate having a first face and a second face opposite to the first face, the display substrate including a display area and a non-display area in the first face; a Chip-On-Film (COF) component disposed on the second face, the Chip-On-Film component comprising a COF film and an integrated circuit
(Continued)

(IC) chip on the COF film; a connection hole located in the non-display area and at least penetrating the display substrate and the COF film; and an electrical connector disposed in the connection hole and electrically connecting the display substrate and the Chip-On-Film component.

15 Claims, 7 Drawing Sheets

(56) References Cited

U.S. PATENT DOCUMENTS

| 2013/0342099 | A1 | 12/2013 | Weber et al. | |
|---|---|---|---|---|
| 2016/0079337 | A1* | 3/2016 | Mathew | H01L 51/0097 |
| | | | | 257/40 |
| 2016/0086533 | A1* | 3/2016 | Song | H01L 51/0097 |
| | | | | 345/80 |

FOREIGN PATENT DOCUMENTS

| CN | 104133307 A | 11/2014 |
|---|---|---|
| CN | 104904327 A | 9/2015 |
| CN | 106973520 A | 7/2017 |
| CN | 107037647 A | 8/2017 |
| CN | 107039377 A | 8/2017 |
| CN | 107093606 A | 8/2017 |

OTHER PUBLICATIONS

International Search Report and Written Opinion for International Appl. No. PCT/CN2018/071790, dated Apr. 8, 2018.

\* cited by examiner

-Prior Art-

DISPLAY PANEL, DISPLAY DEVICE, AND METHOD FOR MANUFACTURING DISPLAY PANEL

CROSS-REFERENCE TO RELATED APPLICATIONS

The present application is a U.S. National Stage Application under 35 U.S.C. § 371 of International Patent Application No. PCT/CN2018/071790 filed on Jan. 8, 2018, which claims priority to Chinese Patent Application No. CN201710393763.0 filed on May 27, 2017, the entire disclosure of both of which is hereby incorporated by reference.

FIELD

The present disclosure relates to the field of display technologies, and in particular, to a display panel, a display device, and a method of fabricating a display panel.

BACKGROUND

With the continuous developing of display technologies, display panels are increasingly used in electronic products. Display products (for example, a mobile phone (especially a full-screen phone) or wearable devices (for example, a smart watch) with a narrow bezel attract a large number of consumers because they can provide a better viewing experience for the user.

At present, in most cases, a display product having a narrow bezel is achieved with a connection terminal bending (also, referred to as Pad Bending). However, the display product produced by the connection terminal (hereinafter, also referred to as terminal) bending process has yield problems, and has a display failure phenomenon caused by cracks in the inorganic insulating layer. Further, the prior art terminal bending technology also increases process difficulty and manufacturing cost, and reduces production efficiency. In addition, the formation of the terminal bending region, P, requires an increase in space, and the display product produced by the connection terminal bending process has a low utilization ratio of the substrate.

Therefore, there is a need for a novel display product having a narrow bezel and a method of manufacturing the same.

SUMMARY

Embodiments of the present disclosure provide display panels, display devices, and methods of fabricating the display panels.

According to an aspect of the present disclosure, a display panel is provided that comprises: a display substrate having a display face and a connection hole extending through at least the display substrate in an edge portion of the display face; an electrical connector disposed in the connection hole; and a COF component disposed on a face of the display substrate which is opposite to the display face, the COF component comprising a COF film and an integrated circuit chip on the COF film, wherein electrical connection to the display substrate is provided at least through the electrical connector.

In an embodiment, the display panel further includes a bonding layer for bonding the COF film to a face of the display substrate which is opposite to the display face. In an embodiment, the display substrate further includes a first terminal at the edge portion, an electrical connection to the first terminal being provided through at least the electrical connector, wherein the edge portion is not bent. In an embodiment, an electrical connection between the integrated circuit chip and the display substrate is provided through at least the electrical connector.

In an embodiment, the connection hole and the electrical connector only penetrate the display substrate; the bonding layer is formed of an anisotropic conductive paste; and the COF film further includes a second terminal disposed on a side of the COF film which faces the display substrate, the second terminal being configured to be electrically connected to the electrical connector with the bonding layer. In an embodiment, the connection hole and the electrical connector penetrate the display substrate and the bonding layer; the COF film further includes a second terminal disposed on a side of the COF film which faces the display substrate, wherein the second terminal is configured to be electrically connected to the electrical connector.

In an embodiment, the connection hole and the electrical connector penetrate through the display substrate, the bonding layer, and the COF film; the COF film further includes a second terminal disposed on a side of the COF film which faces the display substrate, wherein the second terminal is configured to be electrically connected to the electrical connector.

In an embodiment, the aperture of the connection hole is greater than or equal to 25 μm. In an embodiment, the display substrate is an electroluminescent display substrate or a quantum dot display substrate. In an embodiment, the COF film is configured to partially overlap a face of the display substrate which is opposite to the display face.

In an embodiment, the display panel further includes: a flexible circuit board attached and electrically connected to a portion of the COF film; and a polarizer disposed in association with a display area of the display face, wherein an electrical connection between the flexible circuit board and the display substrate is provided with the electrical connector, and wherein the edge portion is outside the display area. In an embodiment, the edge portion is located at one end of the display substrate, and the edge portion is sized such that the display substrate can also provide a narrow bezel configuration at the one end when used in a display device.

According to another aspect of the present disclosure, a method of fabricating a display panel includes: providing a display substrate having a display face and a connection hole penetrating the display substrate in an edge portion of the display face; disposing a COF film assembly on the display substrate by providing a COF film on a face of the display substrate which is opposite to the display face, the COF film assembly including the COF film and an integrated circuit chip on a side of the COF film which faces away from the display substrate; and forming an electrical connector in the connection hole, wherein an electrical connection to the display substrate is provided at least with the electrical connector.

According to a further aspect of the present disclosure, a method of fabricating a display panel is provided which includes: providing a display substrate having a display face; and providing a COF film to a face of the display substrate which is opposite to the display face, the COF film being adapted to be attached with an integrated circuit chip on a side thereof which is remote from the display substrate; forming a connection hole, the connection hole extending at least through the display substrate, and the connection hole penetrating through the display substrate in an edge portion of the display substrate; forming an electrical connector in the connection hole, wherein an electrical connection to the display substrate is provided at least by the electrical connector.

In an embodiment, providing the COF film to the face of the display substrate which is opposite to the display face includes: attaching the COF film to the face of the display substrate which is opposite to the display face through a bonding layer. In an embodiment, the display substrate further includes a first terminal at the edge portion, wherein at least an electrical connection to the first terminal is provided by the electrical connector, wherein the edge portion is not bent. In an embodiment, the electrical connection between the integrated circuit chip and the display substrate is provided by at least the electrical connector.

In an embodiment, providing the COF film to the face of the display substrate which is opposite to the display face includes: attaching the COF component to a face of the display substrate which is opposite to the display face through a bonding layer. The connection hole and the electrical connector may penetrate through the display substrate and the bonding layer. The COF film may further include a second terminal disposed on a side of the COF film which faces the display substrate, wherein the second terminal is configured to be electrically connected to the electrical connector.

In an embodiment, providing the COF film to the face of the display substrate which is opposite to the display face includes: providing the COF film to the face of the display substrate which is opposite to the display face by a bonding layer. The connection hole and the electrical connector may penetrate the display substrate, the bonding layer, and the COF film. The COF film may further include a second terminal disposed on a side of the COF film that faces away from the display substrate, wherein the second terminal is configured to be electrically connected to the electrical connector.

In an embodiment, an integrated circuit chip is attached on a side of the COF film that faces away from the display substrate. In an embodiment, the electrical connection between the integrated circuit chip and the display substrate is provided by at least the electrical connector.

In an embodiment, the fabricating method further includes: attaching and electrically connecting a flexible circuit board to a portion of the COF film; and providing a polarizer in association with the display area of the display face, wherein an electrical connection between the flexible circuit board and the display substrate is provided though the electrical connector, and wherein the edge portion is outside of the display area.

According to a further aspect of the present disclosure, a display panel is provided which comprises: a display substrate having a first face and a second face opposite to the first face, the display substrate including a display area and a non-display area in the first face; a Chip-On-Film (COF) component disposed on the second face, the Chip-On-Film component comprising a COF film and an integrated circuit (IC) chip on the COF film; a connection hole located in the non-display area and at least penetrating the display substrate and the COF film; and an electrical connector disposed in the connection hole and electrically connecting the display substrate and the Chip-On-Film component.

In an embodiment, the display panel further comprises a bonding layer disposed between the COF film and the second face of the display substrate.

In an embodiment, the display substrate further includes a first terminal in the non-display area, and the COF film further includes a second terminal, wherein the first terminal and the second terminal is electrically connected through the electrical connector.

In an embodiment, the connection hole and the electrical connector penetrate through the display substrate, the bonding layer and the COF film; the display substrate further includes a first terminal in the non-display area; the COF film further includes a second terminal disposed on a side of the COF film that faces away from the display substrate; and the second terminal is electrically connected to the first terminal through the electrical connector.

In an embodiment, the connection hole has an aperture greater than or equal to 25 µm. In an embodiment, the display substrate is an electroluminescent display substrate or a quantum dot display substrate.

In an embodiment, the COF film is configured to at least partially overlap the non-display area of the display substrate. In an embodiment, the display substrate is a flexible display substrate.

In an embodiment, the display panel further comprises: a flexible circuit board attached to a side of the COF film which faces the display substrate.

According to a still further aspect of the present disclosure, a method of manufacturing a display panel is provided that comprises: providing a display substrate having a first face and a second face opposite to the first face, the display substrate including a display area and a non-display area in the first face; providing a Chip-On-Film (COF) component on the display substrate, wherein the Chip-On-Film component comprises a COF film and an integrated circuit (IC) chip, wherein the COF film is attached to the second side of the display substrate, and the integrated circuit chip is disposed on a side of the COF film that faces away from the display substrate; forming a connection hole in the non-display area, the connection hole penetrating through the display substrate and the COF film; and forming an electrical connector in the connection hole, wherein the COF film is electrically connected to the display substrate through the electrical connector.

In an embodiment, providing the COF component on the display substrate comprises: attaching the COF film to the second side of the display substrate through a bonding layer, wherein the connection hole and the electrical connector further penetrate through the bonding layer.

In an embodiment, the display substrate further includes a first terminal in the non-display area, the COF film further includes a second terminal, and electrical connection of the first terminal and the second terminal is provided at least through the electrical connector.

In an embodiment, the bonding layer is an anisotropic conductive paste.

In an embodiment, the display substrate further includes a first terminal in the non-display area, and the COF film further includes a second terminal, wherein the first terminal and the second terminal is electrically connected through the electrical connector.

In an embodiment, the connection hole is formed by a laser drilling process. In an embodiment, the display substrate is a flexible display substrate.

According to a still further aspect of the present disclosure, a display device is provided that comprises any of the display panels as above-mentioned and described as below. In an embodiment, the display device can have a narrow bezel.

It should be understood that display panels, the methods of manufacturing the same, and the display devices as described above and as will be described in greater detail below are provided in accordance with embodiments of the present disclosure.

Further features and advantages of the present disclosure will become apparent from the detailed description of the exemplary embodiments of the present disclosure with reference to the drawing.

BRIEF DESCRIPTION OF DRAWINGS

The drawings, which constitute a part of the specification, illustrate exemplary embodiments of the present disclosure, and together with the description explain the principles of the present disclosure. In the drawings.

Figure 1:
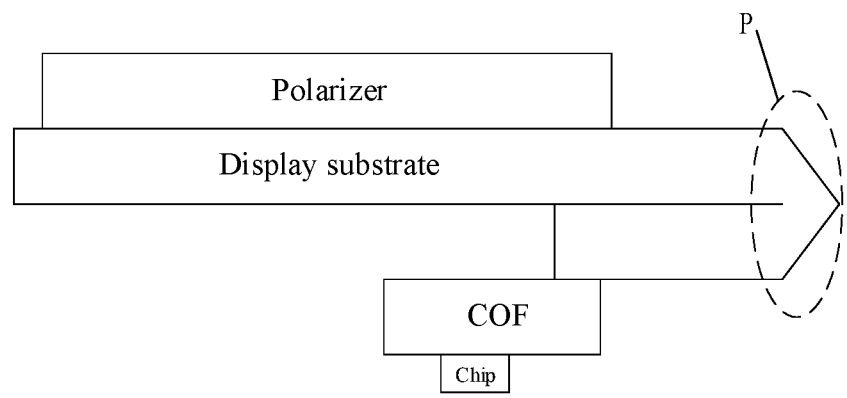
FIG. 1 is a schematic structural view of a display panel in the prior art.

Note that, in the embodiments described below, the same reference numerals are sometimes used to refer to the same parts or the parts having the same functions, and the repeated description thereof may be omitted. In the present specification, like reference numerals and letters are used to indicate the like items, and therefore, once an item is defined in a drawing, it is not necessary to further discuss it in the subsequent drawings.

DETAILED DESCRIPTION OF EMBODIMENTS

Embodiments disclosed in the present specification will be described in detail below with reference to the drawings. It should be understood, however, that the description of the various embodiments are merely illustrative and are not intended to limit the inventions as claimed. The relative arrangement of the components and the steps, the expressions, the numerical values, and the like in the exemplary embodiments are not to be construed as limiting the invention as claimed, unless it is specifically stated otherwise or the context or the principle implies otherwise. In the present specification, techniques, methods, and devices known to those of ordinary skills in the art may not be discussed in detail, but these techniques, methods, and devices should be considered as part of the specification, where appropriate.

The terminology used herein is for the purpose of describing the particular embodiments, and not for limiting. It is to be understood that the words "comprise", "include" or variants thereof as used in the context of the specification are used to specify the presence of the stated features, integers, steps, operations, elements and/or components and/or combinations thereof, and do not preclude the addition or presence of one or more other features, integers, steps, operations, elements, components and/or combinations thereof.

Unless specifically stated otherwise, the term "connect" as used herein means that one element/node/feature can be mechanically, electrically, logically or in other ways coupled with another element/node/feature indirectly or indirectly to allow interaction. That is, "connect" is intended to include both direct and indirect connections of the elements or other features, including the connection with use of one or more intermediate parts.

In the present disclosure, ordinal numbers such as "first", "second", "third", etc. are used to avoid confusion of elements, and are not used to indicate any order of priority in any means.

It will be understood that the various films/layers in the figures are shown for purposes of illustration only, and their sizes and shapes do not represent their true sizes and shapes.

FIG. 1 is a schematic view showing a structure of a display panel prepared by a pad bending technique according to the prior art. As shown in FIG. 1, the terminal portion of the substrate is bent to achieve a reduced frame (relative to the case where it is not bent). The bending also causes the terminals (not shown) on the substrate to face the Chip-On-Film (COF) for electrical connection. However, in the terminal bending region, P, cracks may generate in the inorganic insulating layer, resulting in display failure. In the prior art, a mask process is added to remove an inorganic insulating layer in the connection terminal bending region P; and then another Mask process is added to form an organic insulating layer in the connection terminal bending portion P; thus, display failure caused by cracks occurred in the inorganic insulating layer of the terminal bending region P in the bending process can be voided. Although this avoids the display failure phenomenon caused by the crack of the inorganic insulating layer to some extent, two mask processes are added, which increases the process difficulty and the manufacturing cost, and reduces the production efficiency. Further, the formation of the connection terminal bending portion P requires an increase in space, and the display product produced by the connection terminal bending process has a low utilization ratio regarding the base substrate.

Figure 2A:
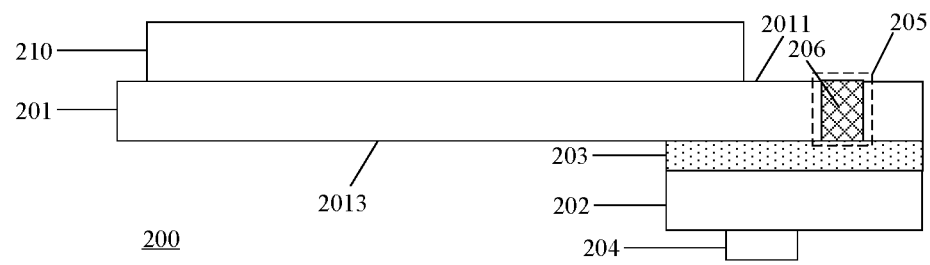
FIGS. 2a to 2f are schematic structural views of a display panel according to an embodiment of the present disclosure.
Figure 2B:
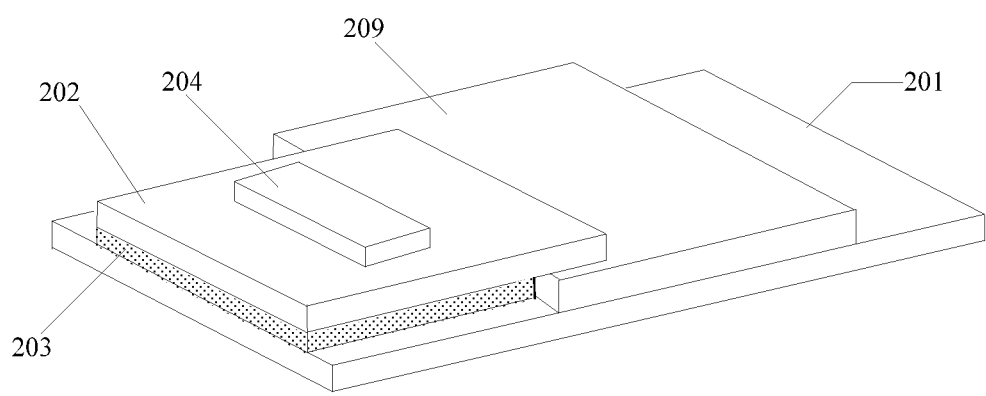

FIGS. 2a through 2f illustrate schematic structural views of a display panel in accordance with some embodiments of the present disclosure. As shown in FIGS. 2a and 2b, the display panel 200 includes a display substrate 201. The display substrate 201 may have a first face, e.g., the upper face 2011 as shown in FIG. 2a, and a second face opposite to the first face, e.g., the lower face 2013 as shown in FIG. 2a. There is a display area and a non-display area in the first face 2011 of the display substrate 201. Therefore, the first face is also often referred to as display face. The non-display area may be located at an edge portion of the display area. As shown in FIG. 2a, a polarizer 210 may be formed on the display area.

As shown in FIG. 2a, at least one connection hole 205 penetrating through the display substrate 201 is formed in the non-display area. The connection holes 205 may be filled with conductive material 206. Here, the member formed of the conductive material filled in the connection hole 205 is referred to as electrical connector (also indicated by 206). Preferably, the electrical connector 206 can fill up the connection hole 205; however, it should be understood that the present disclosure is not limited thereto. The connection hole 205 will best be seen from FIG. 7; in other figures, the dashed boxes are used to schematically indicate the connection hole due to the presence of the electrical connector 206.

Display panel 200 also includes a Chip-On-Film (COF) component (not labeled). The Chip-On-Film component may be disposed on the face (i.e., second face) 2013 of the display substrate which is opposite to the first face. The Chip-On-Film component may include a COF film and an integrated circuit chip on the COF film. The COF film 202 may be disposed on the second face of the display substrate 201 which is opposite to the first face. The integrated circuit chip 204 may be attached to a side of the COF film 202 that faces away from the display substrate 201. There is no limitation on the manner in which the mechanical coupling and/or electrical coupling of the COF film 202 and the integrated circuit chip 204, and those skilled in the art can appropriately apply any technique known in the related art or developed in the future as needed.

In some embodiments of the present disclosure, the COF film 202 (or, the COF component) may be attached to the side (or face) of the display substrate 201 opposite to the first face with a bonding layer 203. In various implementations, the bonding layer 203 may be formed of an insulating paste or an anisotropic conductive paste (ACF). Those skilled in the art will readily understand that electrical conduction in a particular direction and electrical insulation in other directions can be achieved by an anisotropic conductive paste.

Figure 2C:
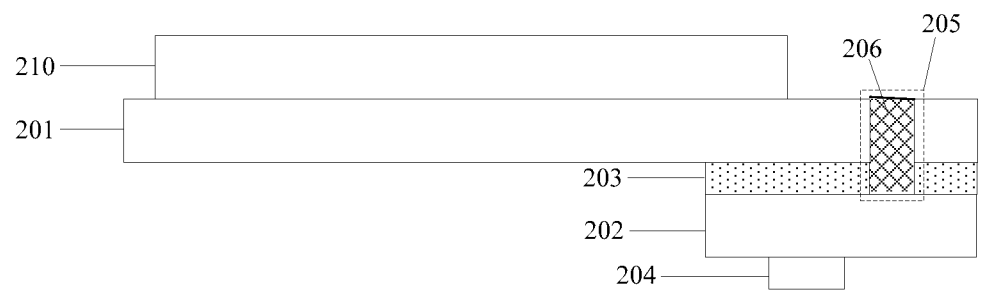
Figure 2D:
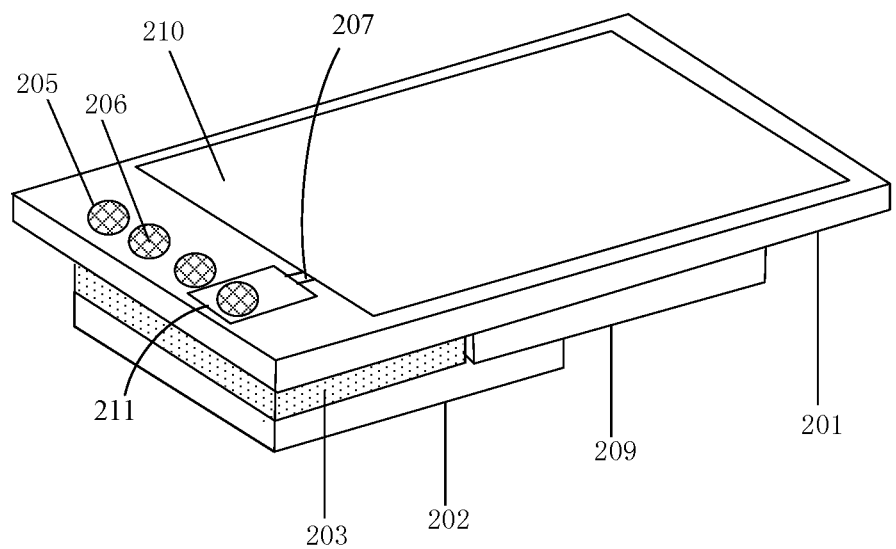

The display substrate 201 may further include a terminal (first terminal) 211 on the first face (as exemplarily illustrated in FIG. 2d). It should be understood that the first face 211 may include a display area (e.g., a portion corresponding to the polarizer 210) and a non-display area located outside the display area. Display substrate 201 may also include wiring (e.g., conductive traces) 207 to connect the terminals 211 and the corresponding components (not shown) in the display area. In the present application, the term "terminal" is intended to include any electrically conductive component suitable for providing or receiving electrical connections, including but not limited to: pad, wire, tap, and the like.

In the above display panels provided by the above embodiments of the present disclosure, the electrical connection to the display substrate may be provided at least through the electrical connector 206, such as but not limited to, the electrical connection between the integrated circuit chip and the display substrate. For example, the electrical connection between the terminal 211 of the display substrate 201 and the connection terminal 208 (second terminal, FIG. 3) disposed on the COF film 202 can be realized by the electrical connector 206 and the anisotropic conductive paste 203 (if any). The anisotropic conductive paste 203 may be disposed between the COF film and the second face of the display substrate. It should be understood that the present disclosure is not limited thereto, and more other implementations will be described later.

In another embodiment, for example, since the anisotropic conductive paste 203 can be electrically conductive only in the direction along which the connection hole 205 extends, in the above display panel according to some embodiments of the present disclosure, as shown in FIG. 2a and FIG. 2b, the connection hole 205 (correspondingly, the electrical connection 206) may be configured to only penetrate the display substrate 201. Connection terminal (for example, as indicated by 208 in FIG. 4) may be disposed on a side of the COF film 202 facing the display substrate 201; for example, the connection terminal 208 may be located directly under the connection hole 205. The second terminal 208 can be configured to be electrically connected to the electrical connector. The first terminal 211 may be connected to the connection terminal 208 of the COF film 202 through the conductive material (electrical connection) 206 and the anisotropic conductive paste 203.

With such a configuration, the edge portion of the first face of the display substrate 201 can be perforated or punched (that is, in the non-display area) before the COF film 202 is bonded to the display substrate 201. Compared with the implementation in which perforation is performed on the display substrate 201 to which the COF film 202 is bonded, for the implementation in which the display substrate 201 is separately punched, the operation is simple, the production cost is low, and production efficiency is high.

Further, in the case where the edge portion of the first face of the display substrate 201 is punched before the COF film 202 is bonded to the display substrate 201, the aperture of the obtained connection hole 205 and the size of the terminal 208 to be subsequently connected thereto can be independent from each other. That is, the apertures of connection holes 205 may be larger than, equal to, or smaller than the sizes of the respective connection terminals 208 to which the connection holes are respectively connected, as long as reliable electrical connections can be achieved therebetween.

The present disclosure of course shall not be limited to the above embodiments. For example, in other embodiments, the display substrate 201 may be punched after the COF film 202 is bonded to the display substrate 201.

As another example, in the display panel according to some embodiments of the present disclosure, the connection hole 205 (and correspondingly, the electrical connection 206) may also be configured to penetrate through the display substrate 201 and the bonding layer 203, as shown in FIGS. 2c and 2d. In such a case, the connection terminal 208 may be disposed on a side of the COF film 202 which faces the display substrate 201. For example, the connection terminal 208 may be located directly under the connection hole 205.

With such a configuration, in some embodiments, the anisotropic conductive paste 203 may be not used for the electrical connection of the display substrate to the Chip-On-Film component (e.g., to the integrated circuit chip of the COF component). For example, the anisotropic conductive paste 203 can only function to bond the Chip-On-Film 202 to the first face of the display substrate 201; therefore, other insulating bonding materials (e.g., insulating glue) may be used instead of the anisotropic conductive paste as the bonding layer 203. However, the present disclosure shall not be limited thereto. For example, the conductive paste 203 can also be used to electrically connect the electrical components on the back side (i.e., the face opposite the first face) of the display substrate to the COF component, as needed. Alternatively, other bonding agents, such as (but not limited to) an insulating paste or the like, may be used instead of the anisotropic conductive paste to form the bonding layer 203.

Here, in the case where the connection hole 205 is configured to penetrate the display substrate 201 and the bonding layer 203, an electrical connection member 206 can be formed by forming conductive material in the connection hole 205a so that a face contact of the metal material 206 and the COF film 202 can be obtained, thereby the contact resistance can be effectively reduced.

Figure 2E:
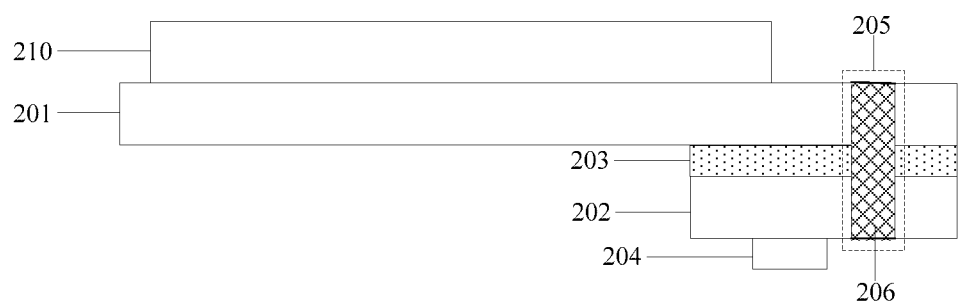
Figure 2F:
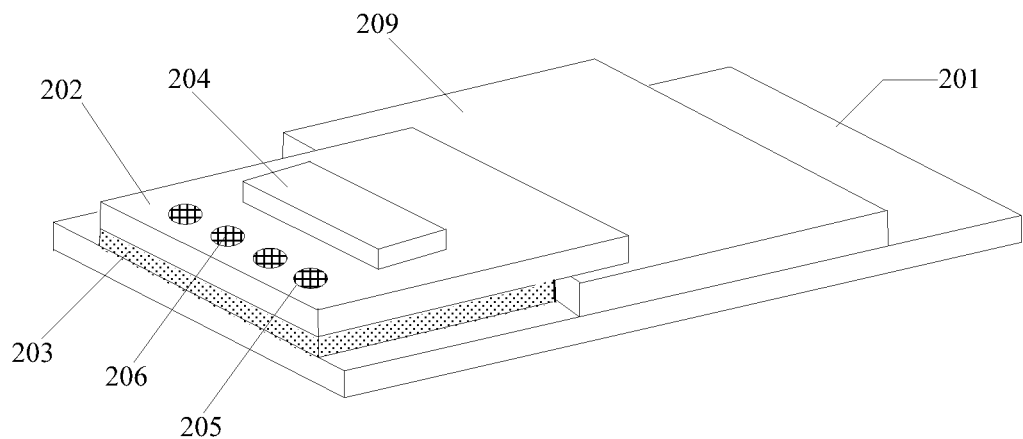

As another example, in another embodiment of the present disclosure, as shown in FIG. 2e and FIG. 2f, the connection hole 205 (and correspondingly, the electrical connector 206) may also be configured to penetrate through the display substrate 201, the anisotropic conductive adhesive 203, and the COF film 202. The connection terminal 208 may be disposed on a side of the COF film 202 which faces away from the display substrate 201; for example, the connection terminal 208 may be located directly under the connection hole 205.

In this case, the anisotropic conductive paste 203 is not used for the electrical connection of the display substrate to the Chip-On-Film component (e.g., to the integrated circuit chip therein), either. For example, the anisotropic conductive paste 203 can only function to bond the COF film 202 to the second face side of the display substrate 201. At this time, other bonding agents, for example, an insulating paste or the like, may be used instead of the anisotropic conductive paste, to form the bonding layer 203.

Here, after the COF film 202 and the second face of the display substrate 201 facing away from the first face are bonded together, the display panel is punched from the side where the COF film 202 is located, to form a connection hole 205 penetrate through the display substrate 201, the anisotropic conductive paste 203 and the COF film 202. In such a way, the display substrate 201 can be directly placed on the device platform, thereby avoiding special processing on the device platform. On the other hand, manufacturing precision can be improved as compared to the bonding process.

Figure 3:
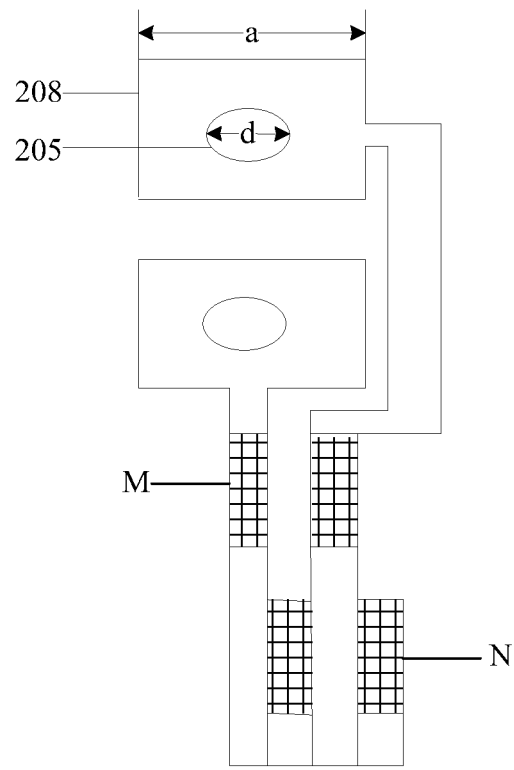
FIG. 3 is a schematic structural view of a connection hole and a connection terminal according to an embodiment of the present disclosure.
Figure 4:
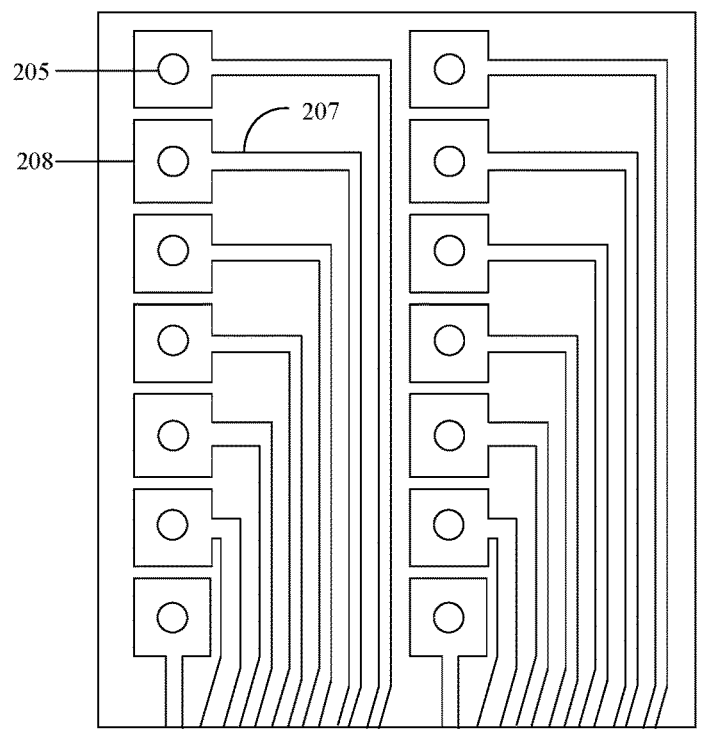
FIG. 4 is a schematic diagram showing a connection relationship between a connection terminal at an edge portion of a display face of a display substrate and a connection terminal disposed on a Chip-On-Film according to an embodiment of the present disclosure.

In a specific embodiment, in the case where the connection hole 205 is configured to penetrate the display substrate 201 and the bonding layer 203, and/or in the case where the connection hole 205 is configured to penetrate the display substrate 201, the bonding layer 203, and the COF film 202, in order to facilitate the connection between the terminal 211 of the non-display area of the display substrate 201 and the connection terminal 208 on the COF film 202, the connection holes 205 may be configured to correspond the connection terminals 208 in an one-to-one way, as shown in FIGS. 3 and 4. In addition, the size, a, of the connection terminal 208 may be set to be larger than the aperture, d, of the connection hole 205.

As such, according to the embodiments of the present disclosure, the connection terminal bending process can be omitted, and there is no terminal bending region at the edge portion of the display panel, thereby the frame of the display panel can be made narrower. In other words, according to embodiments of the present disclosure, the edge portion of the display substrate in which the terminals are formed is not bent.

Here, as shown in the drawings, the edge portion is located at one end of the display substrate; of course, the present disclosure is not limited thereto. In some embodiments, the edge portion is sized such that when used in a display device, the display substrate can also provide a narrow bezel configuration at the one end of the display substrate.

It should be noted that, in the above-mentioned display panels according to the embodiments of the present disclosure, the connection terminals 211/208 may be of any shape, such as triangle, square, circle, etc. When the shape of the connection terminal 208 is substantially circular, the diameter of the connection terminal 211/208 may be set larger than the aperture, d, of the connection hole 205. When the shape of the connection terminal 208 is substantially square, as shown in FIG. 3, the side length, a, of the connection terminal 208 can be set larger than the aperture, d, of the connection hole 205. These also hold true for the terminal 211.

FIG. 3 illustrates a schematic structural view of a connection hole and a connection terminal according to some embodiments of the present disclosure. FIG. 4 is a plan view showing a connection relationship of connection terminals provided on a COF film and electrical connectors provided in connection holes according to some embodiments of the present disclosure.

As shown in FIG. 3, the COF film may further include terminals (e.g., pads) connected to the pins of the integrated circuit chip 204 (as shown with the hatched portions in the figure). A terminal M connected to the connection terminal 208 by a wire (the terminal M may be provided, for example, in the same layer as the connection terminal 208), and a terminal N not connected to the connection terminal 208 (the terminal N may be, for example, disposed in the same layer as the connection terminal 208, or it is also possible to be disposed in a different layer from the connection terminal 208) are shown in FIG. 3. It should be noted that the embodiments/implementations shown herein are merely exemplary rather than limiting.

Generally, the number of connection terminals 208 of the COF film 202 is large and the density thereof is high. In order to efficiently and quickly make the connection holes 205 one-to-one corresponding to the connection terminals 208, in some embodiments of the present disclosure, a laser drilling process may be employed. The connection holes 205 can be obtained with an expected aperture and depth by controlling the diameter and energy of the laser. However, the present disclosure is not limited thereto, and the connection hole 205 may be fabricated by other punching processes known to those skilled in the art.

In some embodiments of the present disclosure, the aperture, d, of the connection hole 205 (as shown in FIG. 3) may be greater than or equal to 25 µm; that is, the minimum value of the aperture, d, of each connection hole 205 may be 25 µm. Here, as shown in FIG. 4, in a plan view, the connection terminal 208 may be configured to cover the connection hole 205, that is, cover the electrical connector 206, so as to provide a reliable electrical connection. This can also be the case for the connection terminal 211.

In some embodiments of the present disclosure, the conductive material 206 may be a material having a small resistivity and a good electrical conductivity, for example, metal material. Of course, the conductive material 206 is not limited thereto, and may be other materials having electrical conductivity, such as indium tin oxide, indium zinc oxide or graphene.

In some embodiments of the present disclosure, the display substrate 201 may be a flexible display substrate or a rigid display substrate. In some embodiments, the display substrate 201 is a flexible display substrate, such as an Organic Light Emitting Diodes (OLED) display substrate, or a Quantum Dot Light Emitting Diodes (QLED) display substrate.

In some embodiments of the present disclosure, the COF film 202 may be disposed on an edge region of a side of the display substrate 201 which faces away from the first face (i.e., the second face opposite to the first face of the display substrate). For example, the edge region may correspond to the non-display area of the display substrate 201. In some examples, the COF may be disposed to at least partially overlap the non-display area of the display substrate, as shown in the figures.

In some embodiments of the present disclosure, the display panel may further include a flexible circuit board 209. As shown in FIGS. 2b, 2d and 2f, the flexible circuit board 209 can be attached and electrically connected to a portion of the COF. The power, charges, control signals, and the like required for pixel driving in the display panel can be provided via the external flexible printed circuit (FPC). For example, power and control signals, etc., can be transmitted to the display panel, such as to terminals 211 of the display panel, through COF film 202 and electrical connectors 206 (and ACF, if needed). In some embodiments, it is also contemplated that the electrical connection between the flexible circuit board and the display substrate can be provided via the electrical connector (first electrical connector) or an additional electrical connector (second electrical connector).

In some embodiments of the present disclosure, in order to enable better display of the display panel, as shown in FIGS. 2*a*, 2*c*, 2*d*, and 2*e*, a polarizer (abbreviated as Pol) 210 can be provided in the display panel in association with the display area of the first face of the display substrate 201. The polarizer 210 can be any suitable polarizer known in the art or developed in the future, and can be attached to the display area using any suitable attachment technique known in the art or developed in the future. Thus, further detailed description thereof is omitted herein.

Figure 5A:
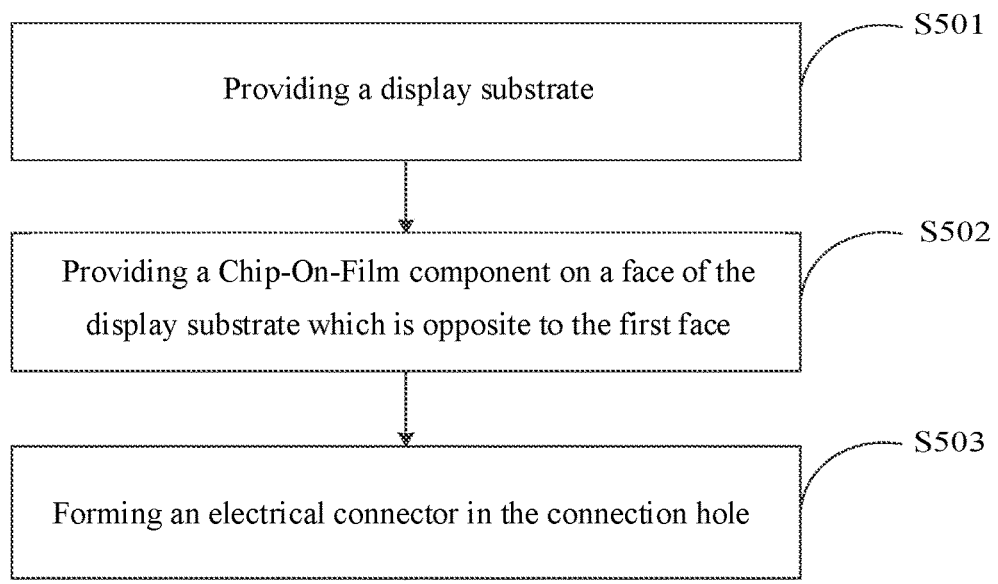
FIGS. 5a and 5b each are flowcharts of methods of fabricating a display panel according to embodiments of the present disclosure.
Figure 5B:
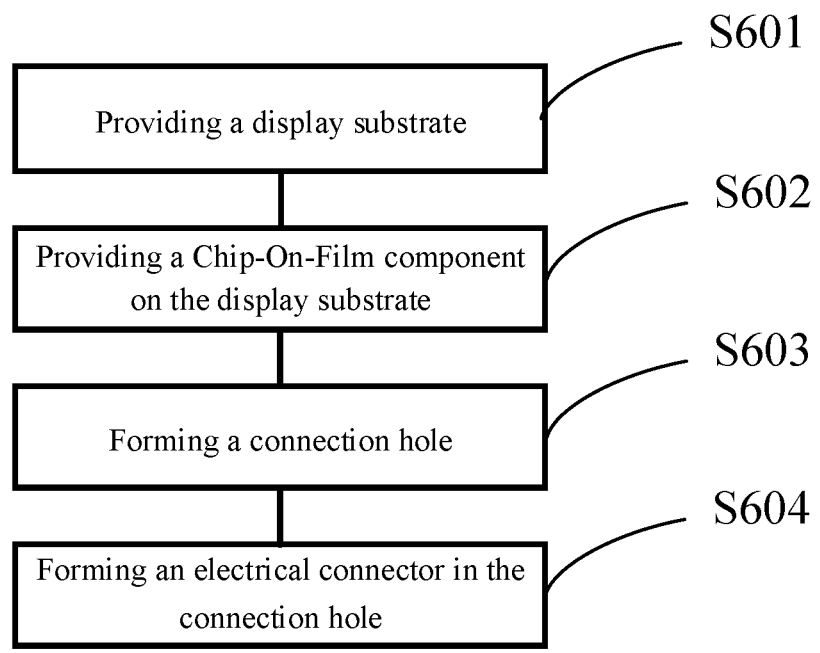

According to some embodiments of the present disclosure, a method of fabricating a display panel is also provided. FIGS. 5*a* and 5*b* respectively illustrate flow charts of methods of fabricating a display panel in accordance with some embodiments of the present disclosure.

A method of fabricating a display panel in accordance with some embodiments of the present disclosure is described below in conjunction with FIGS. 5*a* and 2*a*. As shown in FIG. 5*a*, in step S501, a display substrate 201 is provided. The display substrate 201 may have a display area 2011 and a connection hole 205 penetrating the display substrate in an edge portion of the first face thereof.

In step S502, a Chip-On-Film component is disposed on a face of the display substrate which is opposite to the first face. The Chip-On-Film component may include a COF film 202 and an integrated circuit chip 204 on the Chip-On-Film. In a specific implementation, the COF film may be attached to the side of the display substrate which is opposite to the first face by a bonding layer (e.g., an anisotropic conductive paste) 203. The integrated circuit chip can be located on the side of the COF film that faces away from the display substrate.

In step S503, an electrical connector 206 is formed in the connection hole. For example, the electrical connector 206 can be formed by filling the connection hole with conductive material. In this way, the electrical connection between the electrical connector and the corresponding terminal can be reliably achieved.

Thereby, an electrical connection to the display substrate, such as an electrical connection between the integrated circuit chip and the display substrate, can be provided at least through the electrical connector. For example, electrical connections between the first terminal 211 on the display panel and the second terminal 208 on the COF can be provided through at least the electrical connector 206 and the anisotropic conductive paste 203 (if any).

A method of fabricating a display panel in accordance with further embodiments of the present disclosure is described below in conjunction with FIGS. 5*b* and 2*c* and 2*e*. As shown in FIG. 5*b*, in step S601, a display substrate 201 is provided. The display substrate 201 may have a display area 2011.

In step S602, a Chip-On-Film component is disposed on the display substrate. In one embodiment, a COF film may be disposed on a face of the display substrate which is opposite to the first face thereof. The COF film is suitable for being attached with an integrated circuit chip. For example, the Chip-On-Film component may be attached to the face of the display substrate which is opposite to the first face, by a bonding layer (e.g., an anisotropic conductive paste) 203.

In step S603, a connection hole 205 is formed. The connection hole 205 penetrates through at least the display substrate and the COF film. The connection hole may penetrate the display substrate in the non-display area of the display substrate. If there is a bonding layer (for example, an anisotropic conductive paste 203), the connection holes will also penetrate the bonding layer.

At step S604, an electrical connector 206 is formed in the connection hole. Here, an electrical connection to the display substrate, such as an electrical connection between the COF (or the integrated circuit chip therein) and the display substrate, may be provided at least by the electrical connector.

It should be understood that there is no limitation on the execution order of the steps of the method embodiments described above, unless specifically stated otherwise, or the context imply or express a specific order. For example, according to various embodiments, the step of forming the connection holes penetrating through the display substrate may be performed before or after bonding the COF film (or the COF component). As another example, in the example shown in FIG. 5*a*, the step of forming the electrical connector can be performed before or after the step of disposing of the COF component. In other embodiments, after forming a plurality of connection holes penetrating through the display substrate in the non-display area (for example, edge portion or the peripheral portion of the first face) of the display substrate, the connection holes can be filled with conductive material, and then the COF film can be bonded to a side (i.e., the second face) of the display substrate facing away from the first face of the display substrate with an anisotropic conductive paste.

In other embodiments of the present disclosure, a plurality of connection holes extending through at least the display substrate may be formed in the non-display area of the display substrate in such a manner: forming a plurality of connection holes in the non-display area of the display substrate which penetrate through the display substrate and the anisotropic conductive paste, such that the signal line is connected through the conductive material to the connection terminal disposed on the side of the COF film which faces the display substrate.

In other embodiments of the present disclosure, a plurality of connection holes extending through the display substrate may be formed in such a manner: forming a plurality of connection holes penetrating through the display substrate, the anisotropic conductive paste, and the COF film in the non-display area of the display substrate, such that the signal line is connected through the conductive material to the connection terminals disposed on the side of the COF film which is opposite to the display substrate.

In other embodiments of the present disclosure, the method may further include: bonding a flexible circuit board to a side of the COF film that faces away from the integrated circuit chip.

It should also be understood that the Chip-On-Film component can be disposed to the second face of the display substrate which is opposite to the first face in a variety of manners. For example, an integrated circuit chip may be mounted on the COF film; thereafter, the COF may be attached to a side (face) of the display substrate which faces away from the first face, for example, by a conductive paste. However, the manner in which the COF module is disposed to the display substrate is not limited thereto, as long as the integrated circuit chip is finally attached to the COF film and the COF film is attached to the display substrate.

In some implementations, the display substrate further includes a first terminal at the edge portion (which may correspond to a non-display area) of the display face, the first terminal being electrically connected to the integrated circuit chip by at least the electrical connector. According to an embodiment of the present disclosure, the edge portion is not bent, and the size of the edge portion can be reduced.

According to some embodiments of the present disclosure, as described above, the connection holes (and correspondingly, the electrical connectors) extend through the display substrate and the bonding layer (e.g., the anisotropic conductive paste). The COF film further includes a second terminal disposed on a side thereof facing the display substrate. The second terminal is configured to be electrically connected to the electrical connector.

According to some embodiments of the present disclosure, connection holes (and correspondingly, electrical connectors) may penetrate through the display substrate, the bonding layer, and the COF film. The COF film further includes a second terminal disposed on a side of the COF film that faces away from the display substrate. The second terminal is configured to be electrically connected to the electrical connector. For example, an electrical connection of the second terminal to a respective first terminal can be provided by the electrical connector.

According to some embodiments of the present disclosure, the method may further include: attaching and electrically connecting a flexible circuit board to a portion of the COF film. The flexible circuit board can be used to provide power, control signals, etc. required for pixel driving or displaying. According to some embodiments of the present disclosure, the method may further include: providing a polarizer in association with the display area of the first face. The edge portion may be outside the display area. With the electrical connector, an electrical connection between the flexible circuit board and the display substrate can be provided.

In some embodiments, in order to improve production efficiency, the flexible circuit board may be bonded to the side of the COF film on which the integrated circuit chip is mounted, while the integrated circuit chip is mounted onto the COF film. Of course, the step of bonding the flexible circuit board onto the side of the COF film on which the integrated circuit chip is mounted may be performed before or after the integrated circuit chip is mounted on the COF film.

Figure 7:
FIG. 7 is a cross-sectional view along line AA of the display panel of FIG. 6b.
Figure 8:
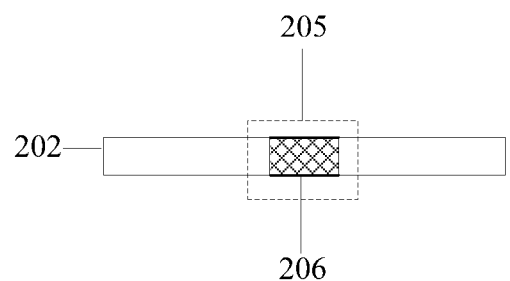
FIG. 8 is a schematic cross-sectional view of the display panel of FIG. 6c taken along line BB.

FIGS. 6a to 6d respectively illustrate structural diagrams of display panels corresponding to some certain steps in a method of fabricating a display panel according to some embodiments of the present disclosure. FIG. 7 is a schematic cross-sectional view of the display panel of FIG. 6b taken along line AA. FIG. 8 is a schematic cross-sectional view of the display panel of FIG. 6c taken along line BB. A method of fabricating a display panel in accordance with some embodiments of the present disclosure is described below in conjunction with FIGS. 6a-6d, 7-8, and 2a-2b.

Figure 6A:
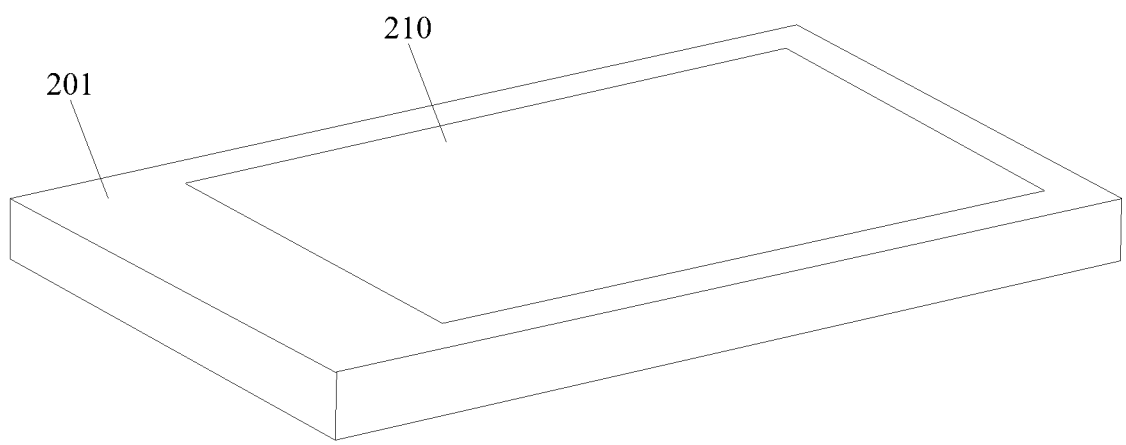
FIGS. 6a to 6d each are schematic structural views of a display panel corresponding to steps in a method for fabricating a display panel according to embodiments of the present disclosure.

As shown in FIG. 6a, a display substrate 201 is provided. Optionally, a polarizer 210 may be attached to the display area of the first face of the display substrate 201. Alternatively, the display substrate 201 may have a polarizer 210 disposed corresponding to the display area.

Figure 6B:
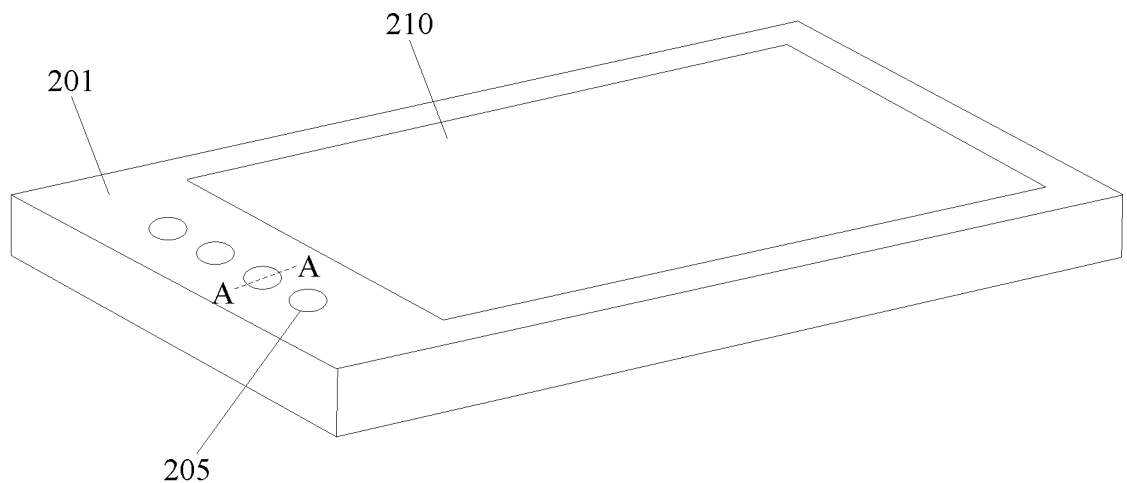

As shown in FIG. 6b and FIG. 7, connection hole(s) 205 penetrating the display substrate 201 may be formed in a non-display area (e.g., an edge portion outside the display area) of the first face of the display substrate 201 by, for example, a laser drilling process.

Figure 6C:
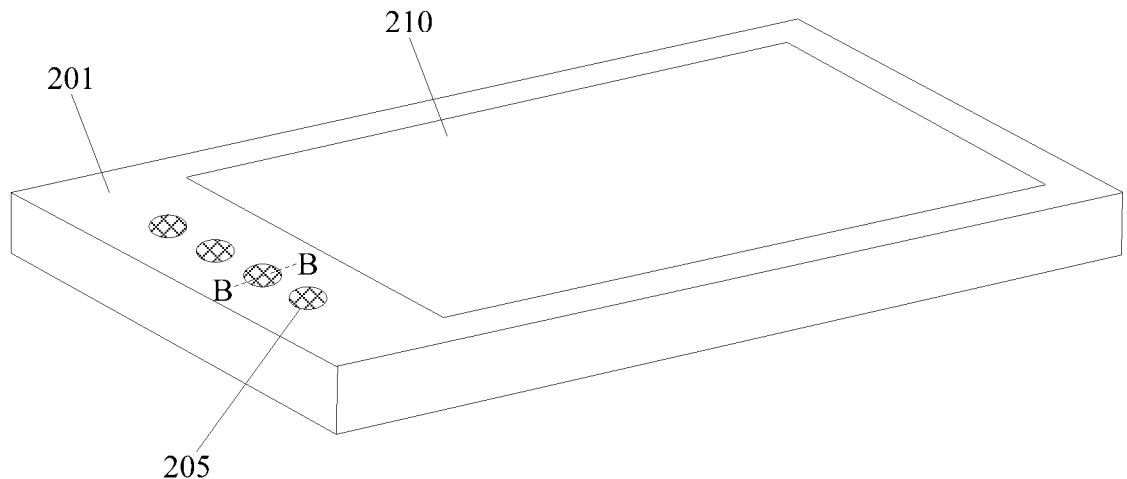

As shown in FIG. 6c and FIG. 8, a plurality of connection holes 205 of the display substrate 201 are filled with conductive material to form electrical connections 206.

Figure 6D:
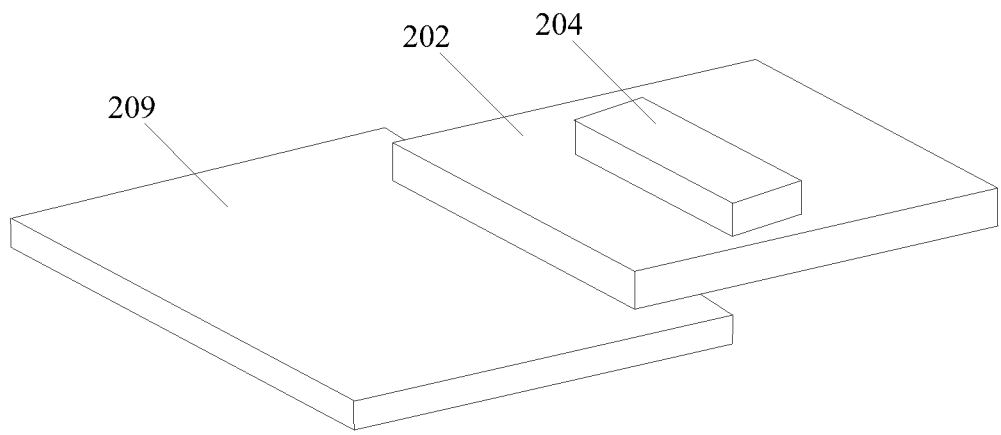

As shown in FIG. 6d, an integrated circuit chip 204 is mounted on a COF film 202, and a flexible circuit board 209 is attached to a side of the COF film 202, which faces away from the integrated circuit chip 204. As shown in the figures, the flexible circuit board 209 can overlap a portion of the COF film 202.

Thereafter, as shown in FIGS. 2a and 2b, the COF film 202 is bonded by the anisotropic conductive paste 203 to a side of the display substrate 201, which faces away from the first face (i.e., to the second face of the display substrate). The integrated circuit chip 204 is located on a side of the COF film 202, which faces away from the display substrate 201. As previously mentioned, it is also contemplated that several of the electrical connectors are used to provide an electrical connection of the FPC to the display substrate.

Thus far, a display panel having the structure shown in FIGS. 2a and 2b are produced. Note that, as previously described, in other embodiments, the connection holes 205 may extend through the display substrate 201 and the COF film 202 and a bonding layer between the display substrate 201 and the COF film 202 (if any).

The display panel according to the embodiments of the present disclosure can be applied to a wide variety of display devices including, but not limited to, mobile phones, tablet computers, television sets, displays, notebook computers, digital photo frames, navigators, smart watches, fitness wristbands, personal digital assistants, or any product or component that has a display function.

According to the embodiments of the present disclosure, a narrow bezel display product having a larger first area (display area), for example, a narrow bezel mobile phone, can be fabricated based on the same size display substrate as compared to the terminal bending technique according to the related art. According to the embodiments of the present disclosure, the connection terminal bending process is omitted, so that the connection terminal bending region does not exist at the edge portion of the display panel. Thereby, the bezel of the display panel is made narrower. And, according to the embodiments of the present disclosure, the substrate utilization efficiency can be improved, the yield can be improved, the manufacturing process can be simplified, and/or the manufacturing cost can be reduced.

It will be apparent to those skilled in the art that various modifications and changes can be made to the embodiments of the present disclosure without departing from the spirit and scope of the present disclosure. The features of the embodiments disclosed herein can be freely combined as appropriate without departing from the spirit and scope of the disclosure. Therefore, it is intended to embrace the modifications and the modifications which fall in the scopes of the claims and the equivalents thereof. The scope of the invention is defined by the appended claims.

What is claimed is:

1. A display panel comprising:
   a display substrate having a first surface and a second surface opposite to the first surface, the display substrate including a display area and a non-display area in the first surface and a first terminal on the first surface in the non-display area;
   a Chip-On-Film (COF) component disposed on the second surface, the Chip-On-Film component comprising a COF film and an integrated circuit (IC) chip on a surface of the COF film, which faces away from the display substrate, and a second terminal on the surface of the COF film;

a connection hole: located in the non-display area and at least penetrating the display substrate and the COF film; and an electrical connector disposed in the connection hole and electrically coupled to the first terminal on the first surface of the display substrate and the second terminal on the surface, which faces away from the display substrate, of the COF film.

2. The display panel according to claim 1 further comprising:
a bonding layer disposed between the COF film and the second surface of the display substrate.

3. The display panel according to claim 2, wherein:
the connection hole and the electrical connector penetrate through the display substrate, the bonding layer and the COF film.

4. The display panel according to claim 1, wherein the connection hole has an aperture greater than or equal to 25 µm.

5. The display panel according to claim 1, wherein display substrate is an electroluminescent display substrate or a quantum dot display substrate.

6. The display panel according to claim 1, wherein the COF film is configured to at least partially overlap the non-display area of the display substrate.

7. The display panel according to claim 1, wherein the display substrate is a flexible display substrate.

8. The display panel according to claim 1, further comprising:
a flexible circuit board attached to a side of the COF film, which faces the display substrate, and electrically connected to the COF film.

9. The display panel according to claim 2, wherein the bonding layer is an anisotropic conductive paste.

10. A display device comprising the display panel according to claim 1.

11. A method of manufacturing a display panel, comprising:
providing a display substrate having a first surface and a second surface opposite to the first surface, the display substrate including a display area and a non-display area in the first surface and a first terminal on the first surface in the non-display area;

providing a Chip-On-Film (COF) component on the display substrate, wherein the Chip-On-Film component comprises a COF film and an integrated circuit (IC) chip on a surface of the COF film, which faces away from the display substrate, and a second terminal on the surface of the COF film;

attaching the COF film to the second side of the display substrate through a bonding layer;

forming a connection hole in the non-display area, the connection hole penetrating through the display substrate, the COF film, and the bonding layer; and forming an electrical connector in the connection hole, wherein the electrical connector is electrically coupled to the first terminal on the first surface of the display substrate and the second terminal on the surface, which faces away from the display substrate, of the COF film.

12. The method according to claim 11, wherein the bonding layer is anisotropic conductive paste.

13. The method according to claim 11, further comprising:
providing a flexible circuit board attached to a side of the COF film, which faces the display substrate, and electrically connected to the COF film.

14. The method according to claim 11, wherein:
the connection hole is formed by a laser drilling process.

15. The method according to claim 11, wherein the display substrate is a flexible display substrate.

* * * * *